United States Patent [19]
Matsumoto et al.

[11] Patent Number: 5,278,839
[45] Date of Patent: Jan. 11, 1994

[54] SEMICONDUCTOR INTEGRATED CIRCUIT HAVING SELF-CHECK AND SELF-REPAIR CAPABILITIES

[75] Inventors: Miki Matsumoto, Ohme; Hiroshi Kawamoto, Kodaira, both of Japan

[73] Assignee: Hitachi, Ltd., Tokyo, Japan

[21] Appl. No.: 693,911

[22] Filed: Apr. 16, 1991

[30] Foreign Application Priority Data

Apr. 18, 1990 [JP] Japan .................. 2-102565

[51] Int. Cl.$^5$ ............................................ G01R 31/28
[52] U.S. Cl. .................... 371/10.2; 371/21.2
[58] Field of Search ............ 371/10.1, 10.2, 21.2, 371/21.1, 22.5; 395/575; 364/245.3, 268.5, 269.2, 970.1, 944

[56] References Cited
U.S. PATENT DOCUMENTS 4,412,281 10/1983 Works ........................ 395/575
4,656,610 4/1987 Yoshida et al. ................. 365/200
4,667,330 5/1987 Kumagai ......................... 371/21.2
4,827,452 5/1989 Toyama et al. .................. 371/10.1
4,905,142 2/1990 Matsubara et al. ............... 371/21.2
5,138,619 8/1992 Fasang et al. ................... 371/21.1

OTHER PUBLICATIONS

IEEE 1989 Custom Integrated Circuits Conference, "Built-In Self-Repair Circuit for High-Density AS-MIC", K. Sawada et al, pp. 26.1.2–26.1.4.

Primary Examiner—Charles E. Atkinson
Attorney, Agent, or Firm—Fay, Sharpe, Beall, Fagan, Minnich & McKee

[57]  ABSTRACT

A semiconductor integrated circuit which has the function of self-checking defective bits, and which informs the exterior of its status when it has reached the status incapable of self-repair due to the limitation of the storage capacity of hardware for repairing the defective bits.

24 Claims, 2 Drawing Sheets

SEMICONDUCTOR INTEGRATED CIRCUIT HAVING SELF-CHECK AND SELF-REPAIR CAPABILITIES

BACKGROUND OF THE INVENTION

The present invention relates to a semiconductor integrated circuit in a memory LSI, a logic LSI, a microcomputer, or the like which has a memory cell array and circuits for selecting desired memory cells included in the memory cell array. More particularly, it relates to techniques for repairing the defects of memory cells in such a semiconductor integrated circuit. By way of example, the techniques are effective when applied, to a memory LSI of large storage capacity such as a DRAM (dynamic random access memory).

Semiconductor integrated circuits have had their densities of integration heightened and their circuit elements microfabricated, and some of them are furnished with redundant constituents in order to enhance the available percentages thereof. When defects are found at an inspection stage of work such as a wafer probe test, a program for selecting the redundant constituents capable of repairing the defects are set with, for example, fuses.

While the conventional defect repair based on the redundant constituents has been furthered one step, a semiconductor integrated circuit with the self-check and self-repair function of deciding the presence or absence of defects by itself and repairing any present defect for itself within the semiconductor integrated circuit has been proposed in IEEE, 1989, CUSTOM INTEGRATED CIRCUITS CONFERENCE, Built-In Self-Repair Circuit for High-Density ASMIC, p. 26. 1. 1–p. 26. 1. 4. Such a technique stated in the bulletin is one which is directed toward ASMICs (Application Specific Memory ICs), and in which a memory is internally checked and self-repaired by affording external clock pulses. It is intended to shorten a time period for testing a wafer etc. and a time period for programming repair addresses with the fuses or the likes in the conventional defect repair based on the redundancy.

SUMMARY OF THE INVENTION

However, the defects of memory cells etc. sometimes occur with the lapse of time in a system, and the self-check and self-repair technique in the prior art cannot cope with the temporally-changing defects. Further, in case of coping with the occurrence of defects in the system, it must be also considered anew that, when the limitation of defect repairs has been exceeded in point of hardware, this situation is notified to the exterior.

An object of the present invention is to provide a semiconductor integrated circuit, which can self-repair its defects that have occurred after the incorporation thereof into a system.

A further object is to provide a semiconductor integrated circuit which can also inform the exterior of a status incapable of self-repair.

The above and other objects and novel features of the present invention will become apparent from the description of this specification when read in conjunction with the accompanying drawings.

Typical aspects of performance of the present invention are briefly summarized as follows:

A timing for self-repairing defective addresses in a memory cell array is generated with timing generation means by a semiconductor integrated circuit itself, and memory cells which are selected on the basis of the output address signals of address generation means adapted to operate in accordance with the timing have the presence or absence of their defects decided by decision means. The address of the memory cell which has been found defective as the result of the decision, is stored in defective address storage means. In accessing the memory cell array, an access address externally supplied is compared with the address held in the defective address storage means. Then, in case of noncoincidence between both the addresses, the memory cell array is accessed, whereas in case of coincidence, a redundant memory cell array is accessed.

When the semiconductor integrated circuit has reached a status incapable of self-repair due to the limitation of the storage capacity of hardware for repairs, it informs the exterior of this status. For this purpose, the integrated circuit is provided with management means for managing whether or not the redundant memory cell array has an empty address substitutable for the defective memory cell of the memory cell array. Herein, when the decision means has found the defect under the status under which no empty address exists, the management means responds to the finding to supply the exterior with the address signal at that time, as well as a control signal for notifying to the effect that the integrated circuit cannot repair the defect.

The self-repair timings by the timing generation means may be generated, not only periodically, but also in accordance with an external instruction on occasion.

In a case where the semiconductor integrated circuit has also an arrangement in which redundancy repair addresses are programmed by utilizing fuses or the like in the form of nonvolatile memory elements, an access address externally supplied in case of accessing the memory cell array from outside the integrated circuit is compared with the address programmed in the nonvolatile memory element and with the address held in the defective address storage means. Then, when the access address does not coincide with either of the programmed address and the held address, the memory cell array is accessed, whereas when the access address coincides with either of the addresses, the redundant memory cell array is accessed.

A situation in which the redundant memory cell to substitute for the address programmed in the nonvolatile memory element beforehand has become defective with the lapse of time, is coped with by disposing repair address allotment means for recognizing the address of the redundant memory cell to substitute for the defective address stored in the defective address programming circuit and for allotting another redundant memory cell for the repair when the defect of the pertinent address has occurred.

According to the expedients described above, the semiconductor integrated circuit itself generates the timing for self-repairing the defective addresses in the memory cell array, and this makes it possible to self-repair even defects which occur after the incorporation of the integrated circuit into a system.

Further, when the hardware limitation in which the defect found in the self-repair operation cannot be repaired occurs, the exterior is notified by the management means together with the corresponding defective address. Thus, a host processor or the like so notified can inhibit an access to the defective memory cell at issue in subsequent accesses in self-restraint fashion. For this reason, the defective memory cell having occurred due to the lapse of time is not accessed, and the reliability of the system is enhanced.

DESCRIPTION OF THE PREFERRED EMBODIMENTS

Figure 1:
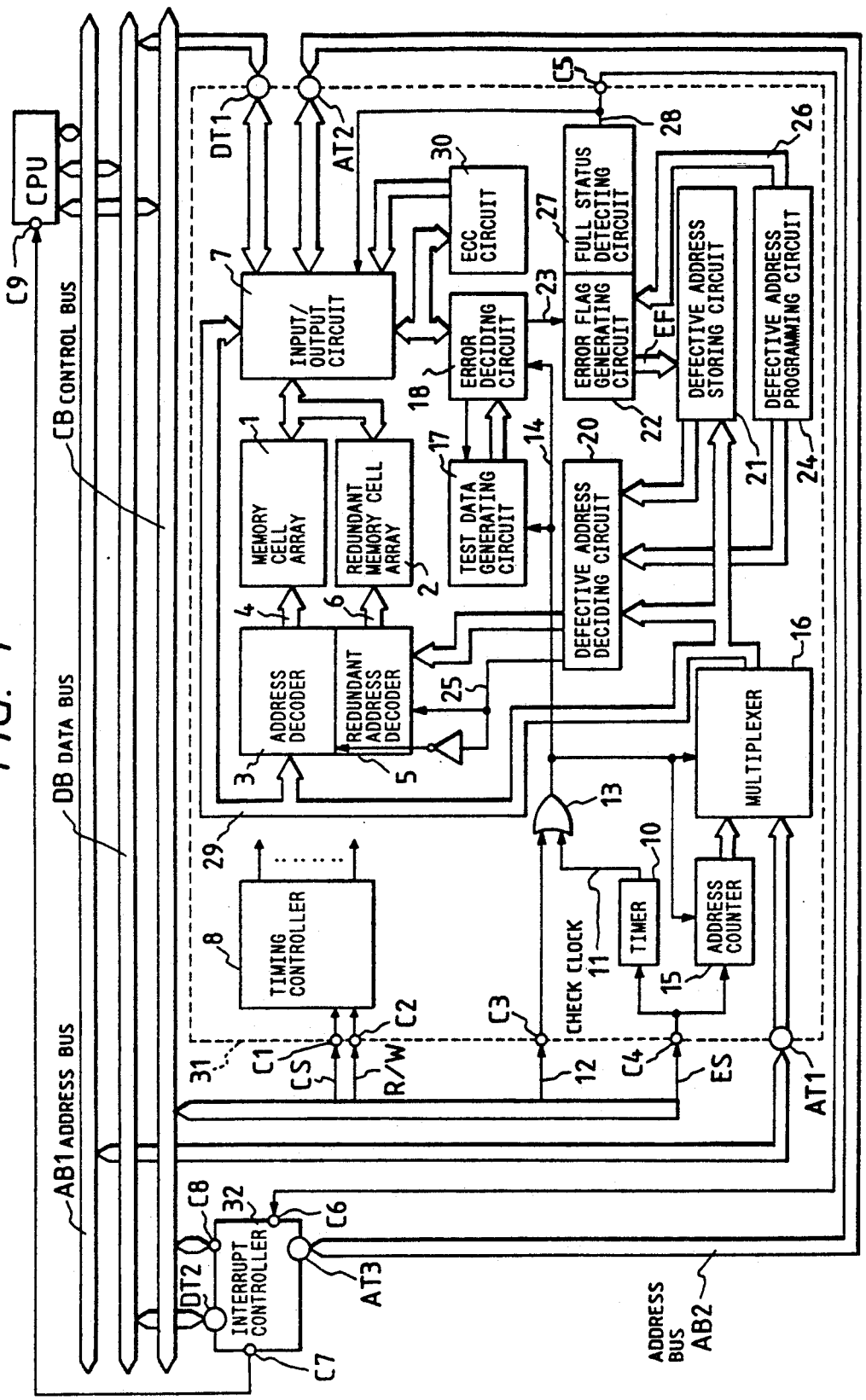
FIG. 1 is a diagram of a microcomputer system which employs a semiconductor integrated circuit embodying the present invention.

Shown in FIG. 1 is a microcomputer system which employs a semiconductor integrated circuit 31 in an embodiment of the present invention. In addition to the semiconductor integrated circuit 31, the microcomputer system includes a central processing unit (hereinbelow, abbreviated to "CPU"), an interrupt controller 32, address buses AB1 and AB2, a data bus DB and a control bus CB. The semiconductor integrated circuit 31 illustrated in the figure is constructed as a memory LSI though not especially restricted, and it is formed on a single semiconductor substrate such as of silicon by known techniques for producing semiconductor integrated circuits.

Numeral 1 indicates a memory cell array, in which a large number of memory cells such as of the static type or the dynamic type are arranged in the shape of a matrix. The selection terminals of the memory cells are coupled to unshown word lines, while the data input/output terminals thereof are coupled to unshown bit lines.

Numeral 2 indicates a redundant memory cell array which includes memory cells (spare cells) for substituting for defective ones among the memory cells included in the memory cell array 1. By way of example, the memory cells of the redundant memory cell array 2 are of the static type and are arranged in the shape of a matrix. Although no special restriction is meant, the word lines and bit lines of the memory cell array 1 and those of the redundant memory cell array 2 are respectively separated from each other in this embodiment.

The memory cells of the memory cell array 1 are addressed by select signals 4 delivered from an address decoder 3. On the other hand, the memory cells included in the redundant memory cell array 2 are addressed by select signals 6 delivered from a redundant address decoder 5. Data items are read out of and written into the addressed memory cells through an input/output circuit 7 and a data terminal DT1 which are interfaced with the data bus DB.

In the semiconductor integrated circuit 31 of this embodiment, a timing control based on an external access is performed by a timing controller 8. The timing controller 8 is supplied with, for example, a chip select signal CS and a read/write signal R/W through the control bus CB and respective control signal terminals C1, C2 from the CPU. When the chip select signal CS is asserted, the timing controller 8 permits the circuit 31 to execute an operation corresponding to the access from the CPU. The input or output direction of data at this time is instructed by the read/write signal R/W.

The semiconductor integrated circuit, 31 of this embodiment self-checks whether or not the memory cells of the memory cell array 1 have defects, and it self-repairs the defects if any. Moreover, when it has reached a status incapable of the self-repair, it informs the exterior of this status. Now, the constituents of the circuit 31 for such functions will be described.

Numeral 10 denotes a timer which generates operation timings for the self-repairs periodically. The timer 10 generates a train of check clock pulses 11 at each of the self-repair operation timings periodically arising. The check clock pulse train 11 is a timing signal which stipulates operation cycles for checking and repairing the defect, and which consists of pulses in a predetermined number equal to the number of operations. In this embodiment, an operation for the self-repair can also be carried out at a desired timing on the basis of a train of check clock pulses 12 which are afforded through a control terminal C3 from the control bus CB. A 2-input OR gate 13 receives the check clock pulse 11 or 12, and delivers an output clock pulse 14 for controlling an operation timing inside the semiconductor integrated circuit 31. Incidentally, an arrangement which makes it possible to afford the check clock pulse train 12 from the control terminal C3 on occasion is not directly pertinent to the present invention.

The timing clock pulse 14 is supplied to an address counter 15, a multiplexer 16, a test data generating circuit 17 and an error deciding circuit 18.

The address counter 15 generates internal address signals for addressing the memory cells of the memory cell array 1 in succession in order to check the defects thereof. The updating timings of the output addresses of the counter 15, in other words, the timings of the address incrementing operations thereof, are synchronous with the cycles of the timing clock pulses 14. The timer 10 and the address counter 15 are permitted to operate for the first time when a check enable signal ES supplied from a control terminal C4 is once asserted. In each of the timer 10 and the address counter 15, the input stage thereof for the check enable signal ES is constructed of a master-slave type flip-flop though no special restriction is intended Thus, once the check enable signal ES has been asserted, the semiconductor integrated circuit 31 is in a status capable of the operations of self-checking and self-repairing the defects, until the signal ES is asserted again.

The multiplexer 16 selects either of the internal address signal delivered from the address counter 15 and an address signal supplied through the address bus AB1 as well as a dedicated address input terminal AT1. By way of example, the internal address signal is selected during the time period of the low level of the timing clock pulse 14, and the external address signal is selected in any other case. Incidentally, the timing clock pulse train 14 assumes a high level while its change is stopped.

Although not especially restricted, the output address signal of the multiplexer 16 is supplied to the address decoder 3, the input/output circuit 7, a defective address deciding circuit 20 and a defective address storing circuit 21. In each of these circuits, the address input stage thereof includes an address latch circuit.

The test data generating circuit 17 delivers test data for checking the presence or absence of the defect, in synchronism with the timing clock pulse 14.

The error deciding circuit 18 reads stored data from the memory cell designated by the output address of the address counter 15, writes the test data into this memory cell, reads out the written test data, and compares the read and written test data items. Owing to the comparison, whether or not the memory cell of the relevant address is defective is checked. The result of the check is afforded to an error flag generating circuit 22. Herein, such check operations are periodically executed in the microcomputer system. Therefore, the data initially read out of the memory cell by the error deciding circuit 18 is held until the end of the check and is thereafter written back into the memory cell of the same address lest the original data having been utilized in the system should be destroyed by the test.

The error flag generating circuit 22 generates an error flag EF when informed of the fact that the check result indicates the defect by a signal 23 which is delivered from the error deciding circuit 18. Then, the circuit 22 pairs the error flag EF with the access address at that time (the address of the memory cell having the defect as corresponds to the address signal delivered from the multiplexer 16) and stores the pair in the defective address storing circuit 21. .Here, though not especially restricted, the error flag EF is set as code information such as an address for selecting the memory cell included in the redundant memory cell array 2. The error flag generating circuit 22 has logic according to which such delivered error flags EF are managed so as not to repeatedly deliver the identical error flag EF.

Although not especially restricted, the defective address storing circuit 21 is configured of memory elements such as static type flip-flops. Accordingly, in a case where the defective address storing circuit 21 itself is not backed up by a battery, it may have the initial storage thereof set by itself, for example, in such a way that, when the system is reset by the turn-on of a power source, the check clock pulses 12 are generated to execute the self check and self-repair operation first. Thus, no problem is posed even when the defective addresses and the error flags EF once stored are lost at the turn-off of the power source. The defective address storing circuit 21 may well be so constructed that the initial storage setting at the turn-on of the power source is automatically done without fail after the detection of the turn-on. Incidentally, when this circuit 21 is configured of electrically-programmable nonvolatile memory elements, it does not always require the backup with the battery or the initial storage setting at the power-on resetting of the system. In this case, however, the automatic self-check at the turn-on of the power source may well be performed.

Numeral 24 indicates a defective address programming circuit in which the addresses to be repaired are programmed by utilizing fuses or the like as nonvolatile memory elements. The defective addresses which are programmed in the defective address programming circuit 24, are ones found by a test at the wafer stage of the semiconductor integrated circuit 31. The defective addresses in the memory cell array 1 here are programmed by the use of the fuses together with affixed code information items which specify the addresses of the redundant memory cell array 2 to substitute for these defective addresses and which correspond to the error flags EF.

The defective address programming circuit 24 delivers error flags corresponding to the defective addresses set therein, to the error flag generating circuit 22 through a path 26.

When the error flag generating circuit 22 manages the error flags EF delivered from itself, it regards the error flags given by the defective address programming circuit 24, as error flags already delivered therefrom. Accordingly, the addresses of the redundant memory cell array assigned by the defective address programming circuit 24 are not stored in the defective address storing circuit 21 in a double manner.

Shown at numeral 27 is a full status detecting circuit which receives information on the error flag management of the error flag generating circuit 22, and which detects the status of the circuit 22 having delivered all the possible error flags. Accordingly, the full status detecting circuit 27 manages the presence or absence of that empty address in the redundant memory cell array 2 which is substitutable for the defective memory cell of the memory cell array 1. When the error deciding circuit 18 has found the defect in the absence of the empty address, the full status detecting circuit 27 responds to the finding to notify the fact that the defect cannot be repaired, to the input/output circuit 7 directly and to the interrupt controller 32 by a control signal 28. Upon receiving the control signal 28 indicative of the impossible defect repair, the input/output circuit 7 sends the address signal corresponding to the defective address as delivered from the multiplexer 16 thereto via a path 29, to the interrupt controller 32 through an address terminal AT2 as well as the address bus AB2.

The defective address deciding circuit 20 compares the access address delivered from the multiplexer 16, with the defective addresses programmed in the defective address programming circuit 24 and with the addresses held in the defective address storing circuit 21. When the access address is not coincident with any of the programmed and held addresses, the circuit 20 allows an access to the memory cell array 1, whereas when it is coincident with any of them, the circuit 20 allows an access to the redundant memory cell array 2. When the result of the decision is noncoincidence, a control signal 25 is brought to a low level, whereby the address decoder 3 is activated, while the redundant address decoder 5 assumes an inactive status, so that the memory cell array 1 is addressed through the address decoder 3. In contrast, when the result of the decision is coincidence, the control signal 25 is brought to a high level, whereby the redundant address decoder 5 is activated, while the address decoder 3 assumes an inactive status, and the error flag paired with the coincident defective address is supplied to the redundant address decoder 5 as address information, whereby the address of the redundant memory cell array 2 to substitute for the defective address of the memory cell array 1 is addressed through the redundant address decoder 5.

Incidentally, the input/output circuit 7 is furnished with an ECC (error check and correcting) circuit 30 for data items which are transferred between this circuit 7 and the exterior of the semiconductor integrated circuit 31. Thus, the circuit 31 can self-correct a data error of several bits.

Next, there will be described the operations of the semiconductor integrated circuit 31 of this embodiment in the individual aspects of repairing defective addresses.

[1] Repair at Stage of Wafer

Regarding the defect of the memory cell array 1 found at the wafer stage of the integrated circuit 31, the predetermined bit of the redundant memory cell array 2 is substituted for the defective bit by setting a program by means of the defective address programming circuit 24. The address of the substitutive bit of the redundant memory cell array 2 here is given to the error flag generating circuit 22 as an error flag. [2] Self-Repair (Defect of Memory Cell Array)

When the periodic self-check and self-repair timing is generated by the operation of the timer 10, the output address signal of the address counter 15 is selected by the multiplexer 16 in synchronism with the timing clock pulse 14. At this time, the defective address deciding circuit 20 compares the address signal with the output of the defective address storing circuit 21 and with the output of the defective address programming circuit 24 so as to decide the coincidence/noncoincidence thereof with either of the outputs.

By way of example, in the case of noncoincidence, the address decoder 3 is activated by the control signal 25, and the memory cell array 1 is addressed by the output address signal of the multiplexer 16. At this time, the error deciding circuit 18 reads data from the addressed memory cell of the array 1, writes test data into this memory cell, reads out the written test data, compares the read and written test data items, and writes the first read data back into this memory cell. Here, in a case where the read and written test data items are noncoincident as a the result of the comparison, that is, where the relevant memory cell is defective, the error deciding circuit 18 informs the error flag generating circuit 22 to that effect by the use of the control signal 23. Then, the error flag generating circuit 22 stores the address of the memory cell in the defective address storing circuit 21, together with a predetermined error flag. Thus, the defective memory cell is substituted by a redundant memory cell specified by the error flag. [3] Self-Repair (Defect of Redundant Memory Cell Array)

When the periodic self-check and self-repair timing is generated by the operation of the timer 10, the output address signal of the address counter 15 is selected by the multiplexer 16 in synchronism with the timing clock pulse 14. At this time, the defective address deciding circuit 20 compares the address signal with the output of the defective address storing circuit 21 and with the output of the defective address programming circuit 24 so as to decide the coincidence/noncoincidence thereof with either of the outputs.

By way of example, in the case of the coincidence, the redundant address decoder 5 is activated by the control signal 25 and is supplied with an error flag pairing with the address of the coincident signal, whereupon the redundant memory cell array 2 is addressed. At this time, the error deciding circuit 18 reads data from the addressed memory cell of the redundant memory cell array 2, writes test data into this memory cell, reads out the written test data, compares the read and written test data items, and writes the first read data back into this memory cell. Here, in a case where the read and written test data items are noncoincident as the result of the comparison, that is, where the relevant redundant memory cell is defective, the error deciding circuit 18 informs the error flag generating circuit 22 to that effect by the use of the control signal 23. Then, the error flag generating circuit 22 stores the address of the redundant memory cell in the defective address storing circuit 21, together with a predetermined error flag. Owing to the error flag managing function of the error flag generating circuit 22, the error flag at this time is made different from one assigned to this circuit 22 by the defective address programming circuit 24. Thus, the defective redundant memory cell in the redundant memory cell array 2 is substituted by another redundant memory cell specified by the error flag.

[4] Status Incapable of Self-Repair

As the self-repair operations described in the above items [2] and [3] proceed periodically, the full status detecting circuit 27 receives information on the management of the error flags from the error flag generating circuit 22. In due course, when the full status detecting circuit 27 decides, in accordance with the finding of a defect based on the error deciding circuit 18, that the circuit 22 has reached a status in which all the error flags have been delivered, in other words, in which the semiconductor integrated circuit 31 is not capable of self-repairing the defect any longer, this circuit 27 responds by notifying the input/output circuit 7 and the interrupt controller 32 with the control signal 28 that the defect cannot be repaired. At that time, the input/output circuit 7 supplies the address signal corresponding to the unrepairable defective address as sent from the multiplexer 16 via the path 29, to the interrupt controller 32 through the address terminal AT2 as well as the address bus AB2. Upon receiving the control signal 28 at its control terminal C6, the interrupt controller 32 accepts the address signal of the unrepairable address supplied from the input/output circuit 7, at the address terminal AT3 thereof. Subsequently, the interrupt controller 32 sends a signal indicating the occurrence of the address signal of the unrepairable address, from the control terminal C7 thereof to the control terminal (interrupt terminal) C9 of the CPU. The CPU knows the occurrence of an interrupt from the signal sent from the controller 32 to the interrupt terminal C9, and suspends a proceeding process. Then, in order to determine the unrepairable address, the CPU sends a control signal for commanding the interrupt controller 32 to deliver the corresponding address signal, to the control terminal C8 of the controller 32 through the control bus CB. In response to the control signal sent from the CPU, the interrupt controller 32 delivers the address signal of the unrepairable address accepted at the address terminal AT3, from a data terminal DT2 to the CPU through the data bus DB. Thereafter, the CPU receives the address signal of the unrepairable address, and executes an interrupt program. Owing to the execution of the interrupt program, the main program of the microcomputer system is altered so that the address signal of the unrepairable address may not be afforded to the semiconductor integrated circuit 31 thenceforth.

As another example, there is a method in which data stored in the unrepairable address is corrected using the ECC circuit 30. When the ECC circuit 30 receives the control signal 28 indicative of the incapability to repair the defect from the full status detecting circuit 27, it corrects an error of several bits for data which are read from the memory cell array 1 into the input/output 7. By way of example, the corrected data are supplied from the data terminal DT1 to the CPU through a data bus. Accordingly, when the ECC circuit 30 is used, the main program need not be limited so as to prevent the access to the unrepairable address of the memory cell array 1 of the semiconductor integrated circuit 31, and hence, the relevant address signal need not be sent to the CPU. Moreover, in this case, the ECC circuit 30 may well be kept non-operating while it is not supplied with the control signal 28. Thus, it is possible to prevent the operating speed of the memory from being limited by that of the ECC circuit 30, while the control signal 28 is not supplied.

The semiconductor integrated circuit of the above embodiment can be formed as MOS-type circuit. Further, it can be formed as an integrated circuit, such as of the Bi-CMOS type, in which bipolar transistors and complementary MOS-FETs (CMOS) coexist.

Especially in a case where the bipolar transistors can be included, the fuses in the defective address programming circuit 24 can be replaced with a bipolar PROM (programmable read-only memory).

Figure 2:
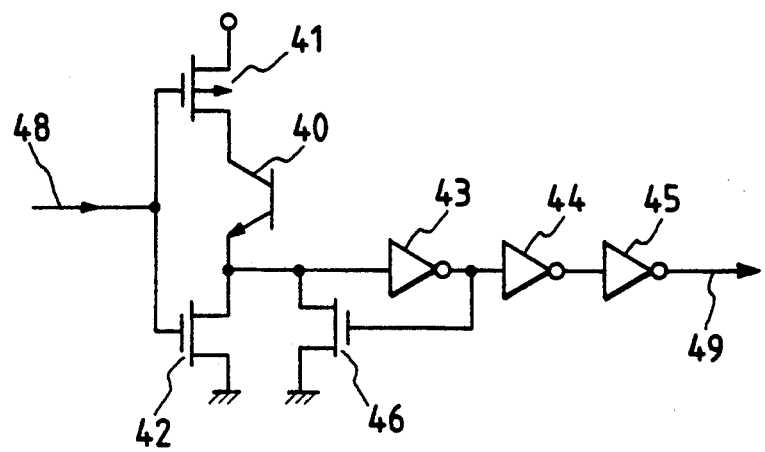
FIG. 2 is a circuit diagram of part of an example of a nonvolatile programming circuit in which a bipolar PROM is used as a nonvolatile memory element.
Figure 3:
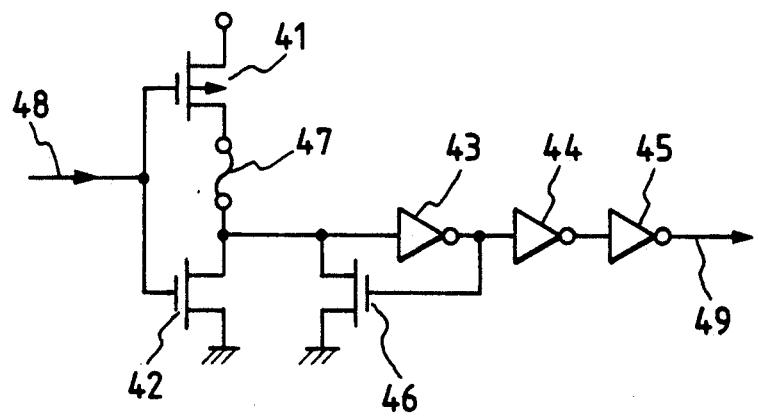
FIG. 3 is a circuit diagram of part of an example of a nonvolatile programming circuit in which a fuse is used as a nonvolatile memory element.

FIG. 2 shows an example of a storage circuit corresponding to one address bit in the defective address programming circuit 24 which employs the bipolar PROM. Referring to the figure, a bipolar PROM transistor 40 is interposed between a P-channel type MOSFET 41 and an N-channel type MOSFET 42 which constitute a CMOS inverter. Series inverters 43, 44 and 45 are successively connected to the node between the drain electrode of the MOSFET 42 and the emitter of the bipolar PROM transistor 40. Incidentally, an N-channel type MOSFET 46 functions to fix the low level input of the inverter 43. The bipolar PROM transistor 40 is, for example, of the junction short-circuiting type. More specifically, an avalanche breakdown current is caused to flow by applying a reverse voltage to the emitter, whereby the transistor 40 has its emitter-base junction short-circuited into a written state. The written state of the transistor 40 corresponds to the non-fused state of a fuse 47 in FIG. 3, and the non-written state the fused state of the fuse 47. In the circuit of FIG. 2, a control signal 48 is set at a low level when the redundancy repair is required. Thus, the level of a signal 49 is determined according to the programmed state of the bipolar PROM transistor 40.

Such a bipolar PROM transistor 40 can reduce the size of layout as compared with the fuse 47 formed of polycrystalline silicon or the like.

According to the above embodiment, the following functional effects are attained:

(1) A timing for self-repairing defective addresses in a memory cell array 1 is generated with a timer 10 by a semiconductor integrated circuit itself, and memory cells which are selected on the basis of the output address signals of an address counter 15 adapted to operate in accordance with the timing have the presence or absence of their defects decided by an error deciding circuit 18. The address of the memory cell which has been found defective as the result of the decision, is stored in a defective address storing circuit 21. In accessing the memory cell array 1, an access address externally supplied is compared with the address held in the defective address storing circuit 21. Then, in case of the noncoincidence between both the addresses, the memory cell array 1 is accessed, whereas in case of the coincidence, a redundant memory cell array 2 is accessed. Therefore, the integrated circuit can self-repair even defects which have occurred after the incorporation thereof into a system.

(2) When the semiconductor integrated circuit has reached a status incapable of self-repair due to the limitation of the storage capacity of hardware for repairs, it informs the exterior of this status. For this purpose, the integrated circuit is provided with management means 22, 27 for managing whether or not the redundant memory cell array 2 has an empty address substitutable for the defective memory cell of the memory cell array 1.

Herein, when the error deciding circuit 18 has found the defect under the status under which no empty address exists, the management means responds to the finding to supply the exterior with the address signal at that time, as well as a control signal 28 for notifying to the effect that the integrated circuit cannot repair the defect. Therefore, the exterior is informed of the status in which the hardware-wise limitation to the defect repairs has been reached and in which the defect found in the self-repair operation cannot be repaired, together with the corresponding defective address by the management means. Thus, a host processor or the like so informed can inhibit access to the defective memory cell at issue in subsequent accesses in self-restraint fashion.

(3) The self-repair timings by the timer 10 are generated, not only periodically, but also in accordance with an external instruction on occasion, whereby the idle time of the semiconductor integrated circuit in the system can be effectively utilized. By way of example, the operation of readily initializing the defective address storing circuit 21 in the form of a volatile memory (a general self-check and self-repair operation for the whole memory cell array 1) can be conducted by utilizing a system reset period in the operation of turning "on" a power source.

(4) In a case where the semiconductor integrated circuit has an arrangement in which redundancy repair addresses are programmed by utilizing fuses or the like in the form of nonvolatile memory elements, even a situation in which a redundant memory cell to substitute for the address programmed in the nonvolatile memory element beforehand has become defective with the lapse of time can be coped with by the function of the management means 22 which recognizes the address of the redundant memory cell to substitute for the defective address stored in the defective address programming circuit 24 and which allots another redundant memory cell for the repair when the defect of the pertinent address has occurred.

Although, in the above, the invention made by the inventors has been described in detail in conjunction with the embodiment, it is needless to say that the present invention is not restricted thereto, but that it can be variously altered within a scope not departing from the purport thereof.

By way of example, the foregoing embodiment has been described as comprising the defective address programming circuit 24 in which the defective addresses at the wafer stage are programmed in the nonvolatile memory elements. However, such a circuit can be omitted, and defective addresses may well be coped with by the defective address storing circuit 21 only.

In addition, the foregoing embodiment has been described as backing up the data of the defective address storing circuit 21 with a battery and as constructing it out of the electrically-programmable nonvolatile memory elements, but the present invention is not restricted thereto.

The status in which a defect having occurred cannot be repaired, is notified to the exterior by the signal 28 by way of example. However, in a case where a necessary logic circuit is included within the semiconductor integrated circuit 31, the status can be coped with by employing the internal circuit.

Besides, the ECC circuit 30 can be omitted.

Further, the expression "memory cell array" in the present invention is not restricted to the construction in which the memory elements are arranged in the shape of a matrix and permit random accesses thereto, but it shall be grasped as a concept covering also a register array such as a set of registers, or shift registers of the parallel-in and parallel-out type, etc.

Although, in the above description, the invention made by the inventors has been chiefly explained as to the case of the application to the memory LSI forming the background field thereof, the present invention is not restricted thereto, but is extensively applicable to various semiconductor integrated circuits such as the logic LSI of a microcomputer.

Effects which are attained by typical aspects of performance of the present invention, will be briefly explained below:

A semiconductor integrated circuit is endowed with a function according to which the circuit itself generates, at least, a timing for self-checking and self-repairing a defective bit and controls the timing generation. This brings forth the effect that the integrated circuit can self-repair even defects which occur after the incorporation of the circuit into a system.

The semiconductor integrated circuit is provided with management means for managing whether or not a redundant memory cell array has an empty address. Herein, when a new defect in a memory cell array has been found under a status under which no empty address exists, the management means responds to the finding to supply the exterior with an address signal at that time, as well as a control signal for notifying the fact that the integrated circuit cannot repair the defect. Thus, when the semiconductor integrated circuit has reached the status incapable of self-repair due to the limitation of the storage capacity of hardware for repairs, it can inform the exterior of this status. Accordingly, a host processor or the like so informed can easily inhibit access to the defective memory cell at issue in subsequent accesses in self-restraint fashion.

The self-repair timings by the timing generation means may be generated, not only periodically, but also in accordance with an external instruction on occasion. Thus, by way of example, the operation of storing the defective addresses in the nonvolatile memory elements of in a defective address storing circuit and thus initializing the defective address storing circuit can be readily performed by utilizing a system reset or power-on reset period. Also, it becomes possible to effectively utilize the idle time of the semiconductor integrated circuit.

In a case where the semiconductor integrated circuit has an arrangement in which redundancy repair addresses are programmed by utilizing fuses or the like in the form of nonvolatile memory elements, the address of the redundant memory cell to substitute for the defective address stored in the defective address programming circuit is recognized, and another redundant memory cell for the repair is allotted when the defect of the pertinent address has occurred. This brings forth the effect that even a situation in which a redundant memory cell to substitute for the address programmed in the nonvolatile memory element beforehand has become defective with the lapse of time can be handled.

What is claimed is:

1. A semiconductor integrated circuit device formed on a single chip for testing a memory cell for defects, comprising:

an address terminal which is supplied with a first address corresponding to a memory cell to be tested for defects;

first memory means including a first plurality of word lines, a first plurality of data lines, and a first plurality of memory cells each of which has a selection terminal coupled to a corresponding one of said first plurality of word lines and a data input/output terminal coupled to a corresponding one of said first plurality of data lines;

second memory means including a second plurality of word lines, a second plurality of data lines, and a second plurality of memory cells each of which has a selection terminal coupled to a corresponding one of said second plurality of word lines, and a data input/output terminal coupled to a corresponding one of said second plurality of data lines, said second plurality of memory cells serving to substitute for defective ones of said first plurality of memory cells of said first memory means;

address generation means for delivering a second address by which to select one word line from among said first plurality of word lines which are included in said first memory means;

first selection means for selecting one word line from among said first plurality of word lines which are included in said first memory means;

second selection means for selecting one word line from among said second plurality of word lines which are included in said second memory means;

error decision means for reading out data stored in the memory cell corresponding to said second address, the memory cell being coupled to said word line selected by said first selection means, for deciding whether or not said memory cell is defective by comparing the data read out from the memory cell with predetermined data, and for delivering a signal of a result of the decision;

address storage means for receiving and storing said second address when said error decision means delivers a signal which indicates that said memory cell coupled to said selected word line is defective; and address decision means for determining whether an address of a memory cell of said first emory means is defective by comparing the first address and the second address stored in said address storage means, so as to decide coincidence/noncoincidence of the first and second addresses, including means for delivering said first address to said second selection means when the first and second addresses have been decided to be coincident by said address decision means, and means for delivering said first address to said first selection means when the first and second addresses have been decided to be noncoincident;

wherein said address generation means delivers the second address to the first selection means, and wherein the first and second selection means select a word line from the first and second plurality of word lines, respectively, based upon addresses delivered thereto.

2. A semiconductor integrated circuit device according to claim 1, wherein said error decision means includes a test data generating circuit for generating test data, and wherein said test data are the predetermined data to which the data read out from the memory cell by the error decision means are compared.

3. A semiconductor integrated circuit device according to claim 2, wherein said error decision means writes the test data from said test data generating circuit into the memory cell coupled to said word line selected in accordance with said second address delivered from said address generation means, reads out the written test data, compares said written test data with the read test data so as to decide whether or not said memory cell of said second address is defective, and delivers said signal of the result of the decision.

4. A semiconductor integrated circuit device according to claim 3, wherein said address storage means includes an error flag generating circuit for delivering an error flag when it has received a decision result signal indicative of a defect from said error decision means.

5. A semiconductor integrated circuit device according to claim 4, wherein said address storage means stores the error flag from said error flag generating circuit, in addition to said address of the defective memory cell.

6. A semiconductor integrated circuit device according to claim 5, wherein said error flag generating circuit includes logic means for preventing repeated delivery of an error flag for the respective addresses of the defective memory cells.

7. A semiconductor integrated circuit device according to claim 1, further comprising a timer circuit for generating periodic operation timing signals for controlling the delivery of signals within said semiconductor integrated circuit device.

8. A semiconductor integrated circuit device according to claim 1, further comprising a switch circuit which selects one of said first address supplied from said address terminal and said second address delivered from said address generation means.

9. A semiconductor integrated circuit device according to claim 1, further comprising an error check and correcting circuit for receiving the data read out from the memory cell corresponding to the second address, for correcting a data error of several bits in the read-out data when no memory cells from said second memory means are available for substitution, and for outputting the corrected read-out data.

10. A semiconductor integrated circuit device according to claim 9, further comprising a CPU and an output circuit for receiving the error decision signal from the error decision means and for feeding the CPU with said second address when the output circuit has received the decision result signal rom said error decision means.

11. A semiconductor integrated circuit device as claimed in claim 9, further comprising full status detecting circuit means for determining whether one of said second plurality of memory cells is available for substitution, and for providing a control signal to activate said error check and correcting circuit only when none of said second plurality of memory cells is available for substitution.

12. A semiconductor integrated circuit device as claimed in claim 1, wherein said first plurality of memory cells and said second plurality of memory cells are static memory cells.

13. A semiconductor integrated circuit device as claimed in claim 1, wherein said first plurality of memory cells are dynamic memory cells.

14. A semiconductor integrated circuit device as claimed in claim 1, wherein said address storage means comprises a plurality of static flip-flop memory elements.

15. A semiconductor integrated circuit device as claimed in claim 1, further comprising defective address programming means having a plurality of memory elements for programmably storing defective addresses of memory cells of the first memory means, and for outputting a stored defective address to the address decision means, wherein the address decision means further determines whether the address of the memory cell of the first memory means is defective by comparing the first address with the stored defective address received from the defective address programming means, said delivering means further delivering said first address to said second selection means when coincidence is found between the first address and the stored defective address.

16. A semiconductor integrated circuit device as claimed in claim 15, wherein the plurality of memory elements of said defective address programming means comprise nonvolatile memory elements.

17. A semiconductor integrated circuit device as claimed in claim 15, wherein said plurality of memory elements comprise bipolar PROM transistor circuit elements.

18. A semiconductor integrated circuit device as claimed in claim 15, wherein the defective addresses programmably stored in said defective address programming means are determined during prefabrication wafer testing.

19. A semiconductor integrated circuit device as claimed in claim 15, further comprising means for comparing the second address with the defective addresses programmably stored in said defective address programming means, and for delivering a control signal indicative of the result of the comparison.

20. A semiconductor integrated circuit device as claimed in claim 19, wherein said address decision means comprises said means for comparing the second address with the defective addresses of said defective address programing means.

21. A semiconductor integrated circuit device as claimed in claim 1, wherein said address decision means compares the first address with all addresses stored in said address storage means.

22. A semiconductor integrated circuit device as claimed in claim 1, wherein, when the second selection means selects a word line from the second plurality of word lines, said error decision means reads out data stored in one of said second plurality of memory cells corresponding to the selected word line, compares the data read out from said one of said second plurality of memory cells with predetermined data, and delivers a signal of a result of the comparison as an indicator of whether said one of said second plurality of memory cells is defective.

23. A semiconductor integrated circuit device as claimed in claim 1, wherein said semiconductor integrated circuit device is a MOS circuit.

24. A semiconductor integrated circuit device as claimed in claim 1, wherein said semiconductor integrated circuit device is a bi-CMOS circuit.

* * * * *